(12) United States Patent
Otsubo et al.

(10) Patent No.: US 9,961,768 B2
(45) Date of Patent: May 1, 2018

(54) MULTILAYER WIRING SUBSTRATE, MANUFACTURING METHOD THEREFOR, AND SUBSTRATE FOR PROBE CARD

(71) Applicant: Murata Manufacturing Co., Ltd., Kyoto (JP)

(72) Inventors: Yoshihito Otsubo, Kyoto (JP); Toru Meguro, Kyoto (JP); Tatsunori Kan, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 22 days.

(21) Appl. No.: 14/919,058

(22) Filed: Oct. 21, 2015

(65) Prior Publication Data

US 2016/0044782 A1 Feb. 11, 2016

Related U.S. Application Data

(63) Continuation of application No. PCT/JP2013/080268, filed on Nov. 8, 2013.

(30) Foreign Application Priority Data

Apr. 26, 2013 (JP) ................................. 2013-094080

(51) Int. Cl.
*H05K 1/00* (2006.01)
*H05K 1/09* (2006.01)
(Continued)

(52) U.S. Cl.
CPC ........... *H05K 1/09* (2013.01); *H01L 21/4867* (2013.01); *H01L 23/49822* (2013.01);
(Continued)

(58) Field of Classification Search
CPC ........ H05K 1/09; H05K 1/0298; H05K 1/115; H05K 3/4644; H05K 3/4038; H05K 3/42;
(Continued)

(56) References Cited

U.S. PATENT DOCUMENTS

| 5,147,208 A | * | 9/1992 | Bachler | ................. | H01R 12/61 |
| | | | | | 29/846 |
| 5,394,013 A | * | 2/1995 | Oku | ....................... | H01L 24/03 |
| | | | | | 257/758 |

(Continued)

FOREIGN PATENT DOCUMENTS

| JP | H11-54865 A | 2/1999 |
| JP | 2004-288663 A | 10/2004 |

(Continued)

OTHER PUBLICATIONS

International Search Report issued in Application No. PCT/JP2013/080268 dated Dec. 10, 2013.

(Continued)

*Primary Examiner* — Steven T Sawyer
(74) *Attorney, Agent, or Firm* — Pearne and Gordon LLP

(57) ABSTRACT

A multilayer wiring substrate that can realize a higher-density wiring structure is obtained. Provided is a multilayer wiring substrate, where a multilayer body including a first insulating layer and a second insulating layer stacked on the bottom surface of the first insulating layer includes printed wiring electrodes; the printed wiring electrodes are formed by printing with and sintering conductive paste; the printed wiring electrodes respectively include first wiring electrode portions located on the second insulating layer and second wiring electrode portions respectively joined to first wiring electrode portions; and the second wiring electrode portions respectively extend into through holes and, further, are exposed at the top surface of the first insulating layer.

20 Claims, 9 Drawing Sheets

(51) Int. Cl.
  H05K 1/11    (2006.01)
  H05K 3/40    (2006.01)
  H05K 3/46    (2006.01)
  H05K 1/02    (2006.01)
  H05K 3/00    (2006.01)
  H05K 3/42    (2006.01)
  H01L 23/498  (2006.01)
  H01L 21/48   (2006.01)
  H05K 3/34    (2006.01)

(52) U.S. Cl.
  CPC ........... *H05K 1/0298* (2013.01); *H05K 1/112* (2013.01); *H05K 1/115* (2013.01); *H05K 3/0058* (2013.01); *H05K 3/4038* (2013.01); *H05K 3/4084* (2013.01); *H05K 3/42* (2013.01); *H05K 3/4644* (2013.01); *H05K 3/4667* (2013.01); *H01L 2224/16225* (2013.01); *H01L 2924/0002* (2013.01); *H01L 2924/19105* (2013.01); *H05K 3/3436* (2013.01); *H05K 3/4629* (2013.01); *H05K 2201/0376* (2013.01); *H05K 2201/0382* (2013.01); *H05K 2201/09545* (2013.01); *H05K 2201/09627* (2013.01); *H05K 2201/09836* (2013.01); *H05K 2201/09845* (2013.01); *H05K 2201/1006* (2013.01); *H05K 2203/0278* (2013.01); *H05K 2203/063* (2013.01); *H05K 2203/068* (2013.01); *H05K 2203/1126* (2013.01)

(58) Field of Classification Search
  CPC ....... H05K 3/0058; H05K 2201/09045; H05K 1/112; H05K 1/0306
  See application file for complete search history.

(56) References Cited

U.S. PATENT DOCUMENTS

| | | | |
|---|---|---|---|
| 6,143,116 A | 11/2000 | Hayashi | |
| 6,166,333 A * | 12/2000 | Crumly | H01L 21/4846 174/255 |
| 6,353,540 B1 | 3/2002 | Akiba | |
| 2004/0188812 A1* | 9/2004 | Koschmieder | H01L 23/13 257/678 |
| 2006/0131730 A1* | 6/2006 | Nakamura | H01L 23/13 257/700 |
| 2009/0032293 A1* | 2/2009 | Miyakawa | C08G 59/66 174/257 |
| 2010/0147574 A1* | 6/2010 | Kaneko | H01L 21/4853 174/261 |
| 2016/0143141 A1* | 5/2016 | Ku | H05K 1/112 174/265 |

FOREIGN PATENT DOCUMENTS

| | | |
|---|---|---|
| JP | 2005-259988 A | 9/2005 |
| JP | 2008-288403 A | 11/2008 |
| JP | 2008-300482 A | 12/2008 |
| WO | 96/22008 A1 | 7/1996 |

OTHER PUBLICATIONS

Translation of Written Opinion issued in Application No. PCT/JP2013/080268 dated Dec. 10, 2013.

First Notification of Office Action issued in Chinese Patent Application No. 201380075949 dated May 17, 2017.

* cited by examiner

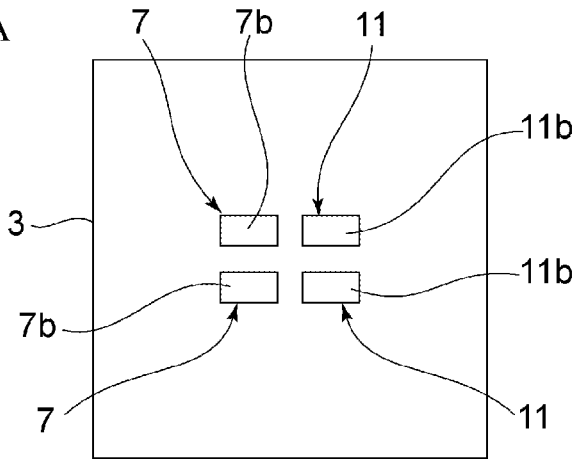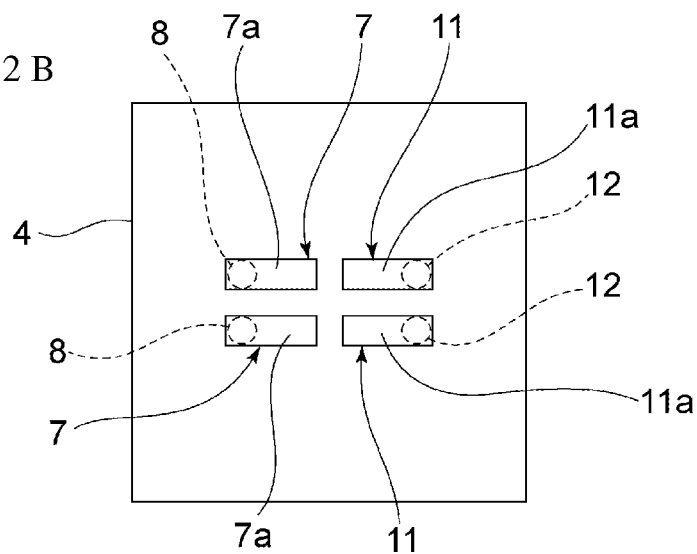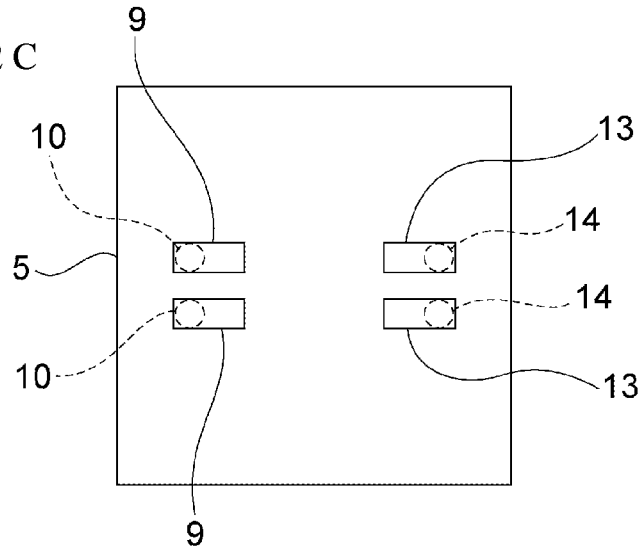

MULTILAYER WIRING SUBSTRATE, MANUFACTURING METHOD THEREFOR, AND SUBSTRATE FOR PROBE CARD

BACKGROUND

Technical Field

The present disclosure relates to a multilayer wiring substrate including a plurality of insulating layers and a manufacturing method therefor. In more detail, the present disclosure relates to a multilayer wiring substrate including wiring electrode portions for interlayer connection, a manufacturing method therefor, and a substrate for a probe card.

In recent years, a multilayer substrate has been widely used to increase the wiring density of a wiring structure. Patent Document 1 described below discloses a multilayer substrate formed by stacking a plurality of insulating layers. Semiconductor devices are mounted on the top surface of this multilayer substrate. A plurality of bumps are formed on the bottom surfaces of the semiconductor devices. On the other hand, a plurality of terminal electrodes are formed on the top surface of the multilayer substrate. The plurality of bumps are respectively connected to the plurality of terminal electrodes. Hence, the pitch of the plurality of terminal electrodes corresponds to the pitch of the plurality of bumps and is very small.

On the other hand, a plurality of external connection terminals for connection to the outside are arranged on the bottom surface of the multilayer substrate. The pitch of the plurality of external connection terminals is made to be larger than the pitch of the upper surface terminal electrodes, thereby making external connection easy. Connection between the terminal electrodes and lower surface external connection terminals described above is performed by wiring electrodes arranged within the multilayer substrate. In other words, the multilayer substrate includes on-layer wiring conductors arranged on insulating layers of the multilayer substrate and via hole conductors provided so as to extend through the insulating layers and connect the on-layer wiring conductors to one another. In other words, the via hole conductors are used as interlayer connection conductors.

Patent Document 1: Japanese Unexamined Patent Application Publication No. 2008-300482

BRIEF SUMMARY

Also in the multilayer wiring conductors disclosed in Patent Document 1, a further increase in the wiring density of a wiring structure is required. This will allow a reduction in the size of the multilayer wiring substrate to be realized and allow semiconductor devices having bumps and the like arranged with a further increased density to be supported.

However, with the existing multilayer wiring substrate disclosed in Patent Document 1, there is a limit in increasing the wiring density of the wiring structure. This is due to the following reasons.

First, the on-layer wiring conductors and the via hole conductors described above are formed by using different methods. Hence, in the configuration in which a plurality of on-layer wiring conductors and a plurality of via hole conductors are connected to one another from the top surface toward the bottom surface as in the above-described multilayer wiring substrate, formation errors and positioning errors of the on-layer wiring conductors and the via hole conductors generated in the formation steps are accumulated. Hence, there exist possible connection failures between the on-layer wiring conductors and the via hole conductors.

To prevent such connection failures described above, the area of a portion of an on-layer wiring conductor connected to a via hole conductor needs to be increased or the via hole conductor itself needs to be increased in thickness.

However, when the size of the on-layer wiring conductor portion connected to the via hole conductor or the diameter of the via hole conductor is increased as described above, an increase in the wiring density of a wiring structure in the surface direction is suppressed. In other words, an increase in the wiring density of a wiring structure is limited.

The present disclosure provides a multilayer wiring substrate and a manufacturing method therefor enabling an increase in the wiring density of a wiring structure. The present disclosure further provides a substrate for a probe card including a multilayer wiring substrate enabling an increase in the wiring density of a wiring structure.

A multilayer wiring substrate according to the present disclosure includes: a multilayer body and a wiring electrode formed within the multilayer body. The multilayer body includes a first insulating layer and a second insulating layer stacked on a bottom surface of the first insulating layer.

The wiring electrode described above is a printed wiring electrode formed by printing with and sintering conductive paste. The first insulating layer includes a through hole extending through the first insulating layer in a stacking direction of the multilayer body. The stacking direction is a direction perpendicular to an extending direction of a top surface of the first insulating layer. The printed wiring electrode includes a first wiring electrode portion and a second wiring electrode portion. The first wiring electrode portion is located on the second insulating layer. On the other hand, the second wiring electrode portion is configured to join to the first wiring electrode portion, configured to extend into the through hole provided in the first insulating layer, and further configured to be exposed at a top surface of the first insulating layer.

In a specific aspect of the multilayer wiring substrate according to the present disclosure, below at least part of the second wiring electrode portion of the printed wiring electrode exposed at the top surface of the first insulating layer, a top surface of the second insulating layer is expanded toward the first insulating layer side compared with the rest of the second insulating layer.

In the multilayer wiring substrate according to the present disclosure, the printed wiring electrode may be provided in a plurality.

In the multilayer wiring substrate according to the present disclosure, the first insulating layer may be located at an outermost layer among the plurality of insulating layers forming the multilayer body. As a result, the wiring density of a wiring electrode structure at the outermost layer can be increased.

In still another specific aspect of the multilayer wiring substrate according to the present disclosure, the printed wiring electrode may include a third wiring electrode portion that joins to an end portion of the second wiring electrode portion farther from the first wiring electrode portion, that extends through the through hole, and that extends to the second insulating layer.

A probe card substrate according to the present disclosure includes: the multilayer wiring substrate configured in accordance with the present disclosure, and a plurality of probes provided on one surface of the multilayer wiring substrate.

A method of manufacturing the multilayer wiring substrate according to the present disclosure is a method of obtaining the multilayer wiring substrate according to the present disclosure, and includes the following steps.

A step of forming the first insulating layer including a through hole.

A step of forming a wiring pattern on the second insulating layer by printing with conductive paste.

A step of stacking the first insulating layer on the second insulating layer such that the through hole overlaps the wiring pattern.

A step of pressure-bonding, in a stacking direction, a multilayer body including the first and second insulating layers such that the wiring pattern is embedded in the through hole in the first insulating layer.

In a specific aspect of the method of manufacturing the multilayer wiring substrate according to the present disclosure, the method further includes a step of stacking an at least one other insulating layer on at least one of the first insulating layer and the second insulating layer as an outermost layer in the stacking direction.

In still another specific aspect of the method of manufacturing the multilayer wiring substrate according to the present disclosure, the other insulating layer is stacked on the second insulating layer as an outermost layer in the stacking direction such that the first insulating layer becomes the outermost surface of the multilayer body.

According to the multilayer wiring substrate and the manufacturing method therefor of the present disclosure, the printed wiring electrode includes a second wiring electrode portion configured to join to the first wiring electrode portion, configured to extend into the through hole provided in the first insulating layer, and further configured to be exposed at a top surface of the first insulating layer and, hence, the wiring density of a wiring structure in the multilayer wiring substrate can be increased and, specifically, the wiring density of a wiring structure in the surface direction of the insulating layer of the multilayer wiring substrate can be increased.

BRIEF DESCRIPTION OF THE SEVERAL VIEWS OF THE DRAWINGS

FIG. 2A to FIG. 2C are schematic plan views of first to third insulating layers in the multilayer wiring substrate of the first embodiment.

DETAILED DESCRIPTION

Hereinafter, the present disclosure will be clarified by describing specific embodiments of the present disclosure with reference to the drawings.

Figure 1:
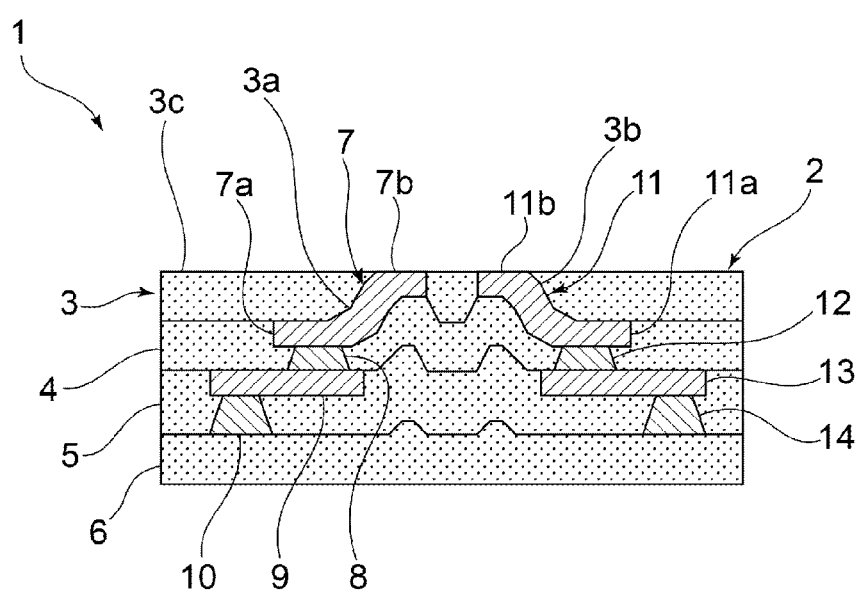
FIG. 1 is a front sectional view of a multilayer wiring substrate according to a first embodiment of the present disclosure.

FIG. 1 is a front sectional view of a multilayer wiring substrate according to a first embodiment of the present disclosure. A multilayer wiring substrate 1 includes a multilayer body 2. The multilayer body 2 has a structure in which first to four insulating layers 3 to 6 are stacked on top of one another in this order from the top. Specifically, the multilayer body 2 is obtained by stacking ceramic sheets on top of one another together with wiring electrodes described later and sintering them. Ceramics described above that may be used include a low-temperature co-fired ceramic (LTCC), but are not specifically limited. An LTCC, which has high dimensional accuracy, can realize a further increase in the wiring density of a wiring structure.

Printed wiring electrodes 7 and 11 are formed within the multilayer body 2. The printed wiring electrode 7 will be described as representative of the printed wiring electrodes 7 and 11.

The printed wiring electrode 7 is formed by screen printing with and sintering conductor paste. The first insulating layer 3 includes through holes 3a and 3b formed therein. The printed wiring electrode 7 includes a first wiring electrode portion 7a located on the second insulating layer 4. Also, the printed wiring electrode 7 includes a second wiring electrode portion 7b joined to the first wiring electrode portion 7a. The second wiring electrode portion 7b extends into the through hole 3a and is exposed at a top surface 3c of the first insulating layer 3.

The single printed wiring electrode 7 includes the first wiring electrode portion 7a as an on-layer wiring conductor and the second wiring electrode portion 7b as an interlayer connection conductor. The second wiring electrode portion 7b further functions as a terminal electrode used for connection to the outside in a portion exposed at the top surface 3c of the first insulating layer 3.

Similarly, the printed wiring electrode 11 also includes a first wiring electrode portion 11a and a second wiring electrode portion 11b.

The multilayer wiring substrate 1 of the present embodiment is characterized by that the printed wiring electrodes 7 and 11 are provided. As described above, the printed wiring electrodes 7 and 11 play the roles of an on-layer wiring conductor and an interlayer connection conductor. Hence, there is no need to form the on-layer wiring conductor and the via hole conductor by using separate steps as in an existing multilayer wiring substrate. As described above, in the case of the method of connecting a wiring electrode as an on-layer wiring conductor to a via hole conductor, an increase in the wiring density of a wiring structure is limited. In addition, an electrode land to which a via hole conductor is connected needs to be larger than the via hole conductor. Hence it was difficult to increase the wiring density.

On the other hand, as will be apparent from the manufacturing method described later, the printed wiring electrode 7 can be easily formed by only applying conductive paste on a ceramic green sheet, stacking a ceramic green sheet forming the first insulating layer 3 on this sheet, and pressure-bonding them. Hence, an increase in wiring density can be easily realized.

In addition, in the existing multilayer wiring substrate, a via hole conductor needs to extend through a ceramic sheet. As a result, it is required that the diameter of the via hole conductor be about 10 μmm to 100 μmm. Hence, an electrode land connected to the via hole conductor needed to have a larger diameter.

In comparison with this, in the present embodiment, it is only required that the second wiring electrode portion 7b of the printed wiring electrode 7 be exposed at the first insulating layer 3. Hence, the area of a portion, exposed at the upper surface, joined to the interlayer connection portion can be decreased. As a result, the size of an electrode land can be also decreased.

Further, with an existing configuration in which via hole conductors are used, there exists a connection portion between a via hole conductor and an on-layer wiring electrode. Hence, the characteristics may be degraded because the impedance changes at the connection portion. On the other hand, the printed wiring electrodes 7 and 11 do not include an internal connection portion where the impedance changes. As a result, degradation in characteristics can be suppressed by reducing the number of connection portions.

In addition, when the wiring density is increased in an existing multilayer wiring substrate, cracks may be generated in a ceramic due to a stress at the time of sintering contraction of the ceramic located between via hole conductors having a diameter of 10 μmm to 100 μmm. On the other hand, in the present embodiment, the printed wiring electrode 7, which has a layer thickness of about 5 μm to 20 μm, extends through the first insulating layer 3 in a direction slanted with respect to the stacking direction in the first insulating layer 3, as illustrated in the figure. Hence, influence on the ceramic between the printed wiring electrodes 7 and 11 is small. As a result, cracks of a ceramic are unlikely to be generated in the multilayer wiring substrate 1 after sintering.

Further, in an existing multilayer wiring substrate, since the volume of a via hole conductor is comparatively large, and since a ceramic and the via hole conductor have different sintering strengths, the via hole conductor may expand upward or the surface of the multilayer wiring substrate may become warped or wavy. On the other hand, in the present embodiment, such a via hole conductor having a relatively large volume is not provided on the top surface side of the multilayer wiring substrate 1. Further, the printed wiring electrodes 7 and 11 have relatively small volumes. Hence, expanded portions are unlikely to be generated, and the top surface of the multilayer wiring substrate 1 is unlikely to become warped or wavy. Hence, the flatness of the multilayer wiring substrate can be enhanced.

In an existing multilayer wiring substrate, a via hole conductor is formed by first forming a through hole by using a laser and then filling the through hole with conductive paste. Hence, the cost of forming a via hole conductor was relatively high. Compared with this, in the present embodiment, the printed wiring electrodes 7 and 11 are formed by using screen printing. Consequently, manufacturing cost can be considerably decreased.

The multilayer wiring substrate 1 is characterized by that the printed wiring electrodes 7 and 11 described above are provided. Referring back to FIG. 1, a via hole conductor 8 is connected to the first wiring electrode portion 7a of the printed wiring electrode 7. The via hole conductor 8 is provided so as to extend through the second insulating layer 4. The lower end of the via hole conductor 8 is connected to a wiring electrode 9 formed on the third insulating layer 5. The wiring electrode 9 is connected to the upper end of a via hole conductor 10 that is provided so as to extend through the third insulating layer 5.

The via hole conductor 8, the wiring electrode 9, and the via hole conductor 10 described above are formed similarly to a wiring electrode and a via hole conductor in an existing multilayer wiring substrate.

Similarly, a via hole conductor 12, a wiring electrode 13, and a via hole conductor 14 are provided also below the printed wiring electrode 11.

FIG. 2A is a schematic plan view of the first insulating layer 3 described above. Here, the second wiring electrode portions 7b and 11b of the printed wiring electrodes 7 and 11 are exposed at the first insulating layer 3.

FIG. 2B is a schematic plan view of the second insulating layer 4. Here, the first wiring electrode portions 7a and 11a exist. Note that dotted line circles represent the via hole conductors 8 and 12 illustrated in FIG. 1.

FIG. 2C is a schematic plan view of the third insulating layer 5 illustrated in FIG. 1. Here, the wiring electrodes 9 and 13 are illustrated. Dotted lines within the wiring electrodes 9 and 13 represent the via hole conductors 10 and 14 located below.

In the multilayer wiring substrate 1, similarly to an existing multilayer wiring substrate, a wiring structure formed of the via hole conductors 8, 10, 12, 14 and the wiring conductors 9 and 13 is connected to the underside of the printed wiring electrodes 7 and 11. However, in the present disclosure, the wiring structure may be formed by connecting a plurality of the printed wiring electrodes 7 and 11 in the stacking direction to one another instead of using the via hole conductors 8, 10, 12, 14 and the wiring electrodes 9 and 13. In this case, the wiring density of the wiring structure can be increased, the flatness of the multilayer wiring substrate can be enhanced, and manufacturing cost can be reduced. However, even with the structure in which only the single printed wiring electrode 7 or 11 is provided in the stacking direction as in the present embodiment, an increase in the wiring density of a wiring structure, suppression of degradation in characteristics, and a reduction in manufacturing cost can be realized, as described above.

In addition, in the present embodiment, since the second wiring electrode portions 7b and 11b of the printed wiring electrodes 7 and 11 are exposed at the outermost surface of the multilayer wiring substrate 1, a reduction in the size of electrode lands and effective suppression of cracks in the ceramic at the outermost layer can be realized, as described above. In addition, the flatness of the top surface of the multilayer wiring substrate 1 can be enhanced.

Note that the via hole conductors 10 and 14 illustrated as components located at the lowermost position are electrically connected to other wiring electrodes and the like in portions not illustrated in FIG. 1.

A configuration in which the via hole conductors 10 and 14 described above are connected to connection terminal electrodes for external connection is not specifically limited.

Note that materials making up the electrodes that form the wiring structures described above are not specifically limited. In other words, the printed wiring electrodes 7 and 11, the wiring electrodes 9 and 13, the via hole conductors 8, 12, 10, and 14, and the like can be formed using conductive paste that appropriately includes conductive powder.

As described above, in addition to the first and second insulating layers 3 and 4, one or more other insulating layers, such as the third and fourth insulating layers 5 and 6, may be appropriately stacked on top of one another. As in the present embodiment, when the first insulating layer 3 is positioned at the outermost surface, another insulating layer will be stacked on the surface of the second insulating layer on the opposite side of the first insulating layer. However, a manner in which the other insulating layers are stacked is not limited to this.

Figure 3:
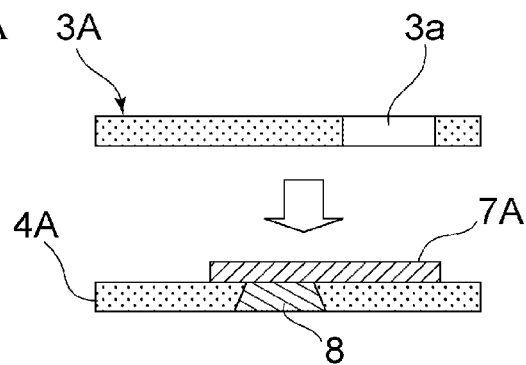
FIG. 3A to FIG. 3C are schematic sectional views for describing the manufacturing method of a multilayer wiring substrate as a second embodiment of the present disclosure.
Figure 3:
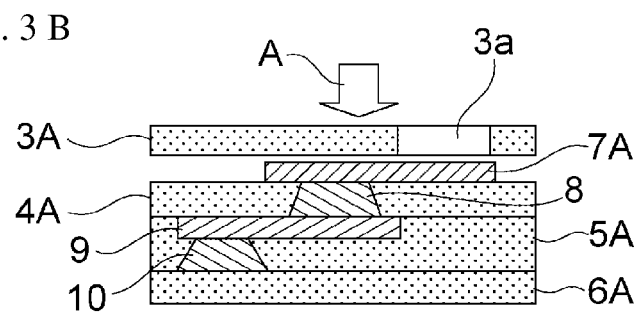
Figure 3:
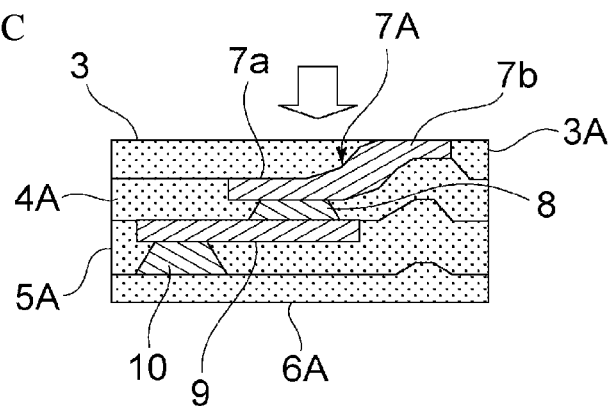

Next, as a second embodiment of the present disclosure, a manufacturing method of the multilayer wiring substrate will be described with reference to FIGS. 3A-3C. FIGS. 3A-3C schematically illustrate steps for manufacturing only the left side portion, in FIG. 1, of the multilayer wiring substrate 1 of the first embodiment. Hence, identical portions are denoted by the same reference numeral and duplicated detailed descriptions thereof will be omitted.

First, as illustrated in FIG. 3A, a first ceramic green sheet 3A having the through hole 3a is prepared. Similarly, a second ceramic green sheet 4A for forming the second insulating layer 4 is prepared.

A printed wiring electrode portion 7A is formed on the second ceramic green sheet 4A by using conductive paste screen printing. The printed wiring electrode portion 7A is arranged such that the through hole 3a is positioned within the printed wiring electrode portion 7A when the first ceramic green sheet 3A is stacked on the second ceramic green sheet 4A. The via hole conductor 8 is formed in the second ceramic green sheet 4A. The via hole conductor 8 is formed by filling a through hole with conductive paste.

Next, as illustrated in FIG. 3B, the second ceramic green sheet 4A described above is stacked on the structure in which third and fourth ceramic green sheets 5A and 6A are stacked on top of one another. The wiring electrode 9 is formed on the top surface of the third ceramic green sheet 5A. The via hole conductor 10 is formed in the third ceramic green sheet 5A so as to be connected to the wiring electrode 9.

Next, as illustrated by an arrow A in FIG. 3B, the first ceramic green sheet 3A is stacked on and pressure-bonded to the second ceramic green sheet 4A. This pressure-bonding causes the printed wiring electrode 7A to enter the inside of the through hole 3a as illustrated in FIG. 3C. As a result, the first wiring electrode portion 7a and the second wiring electrode portion 7b described above are formed.

Then, the above-described raw chip including the first to fourth ceramic green sheets 3A to 6A is sintered. In this way, the wiring electrodes of the multilayer wiring substrate 1 illustrated in FIG. 1 are formed.

As is clear from the above-described manufacturing method, the printed wiring electrode 7 can be formed by only: first screen-printing with conductive paste; and then, preparing, pressure-bonding, and sintering the first ceramic green sheet 3A including the through hole 3a. Hence, it can be seen that the manufacturing steps can be simplified.

As illustrated in FIG. 1 and FIG. 3C, below at least part of the portion of the printed wiring electrode 7 exposed at the top surface of the first insulating layer 3, the upper surface of the second insulating layer 4 may be expanded upward toward the first insulating layer 3 side compared with the rest of the second insulating layer 4. With this configuration, the second wiring electrode portion 7b of the printed wiring electrode 7 can be firmly supported from the backside through a lining. As a result, the second wiring electrode portion 7b can be reliably electrically connected to another wiring electrode, a bump, or the like in a portion thereof exposed at the top surface of the first insulating layer 3.

In FIG. 1 and FIG. 3C, below at least part of the second wiring electrode portion 7b of the printed wiring electrode 7 described above, also the third insulating layer 5 and the fourth insulating layer 6 located below the second insulating layer 4 are formed in such a way as to be expanded upward compared with the rest of the layers. This is due to the fact that at the time when the plurality of green sheets are stacked and pressure-bonded, the ceramic green sheets located below moves upward as conductive paste, forming the printed wiring electrode 7, enters the through hole 3a, as is clear from the manufacturing method described above.

However, it is not required in the present disclosure that the second insulating layer 4 located below be expanded upward, in the second wiring electrode portion 7b of the printed wiring electrode 7 exposed at the first insulating layer 3.

Figure 4:
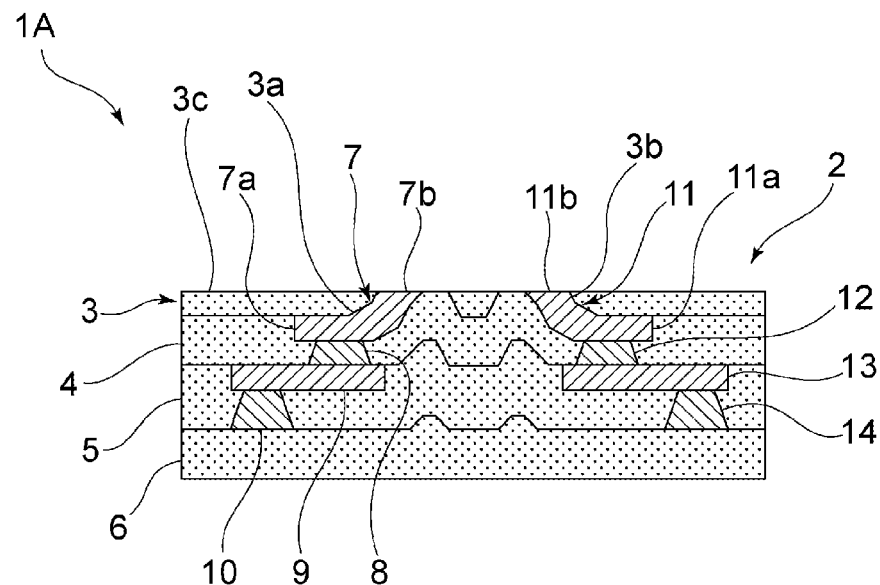
FIG. 4 is a front sectional view of a multilayer wiring substrate according to a modification of the first embodiment.

Note that in order to enhance the flatness of the upper surface of the multilayer wiring substrate 1, the top surface of the multilayer wiring substrate 1 may be ground by using an appropriate grinding method, thereby flattening the surface. FIG. 4 is a front sectional view of a multilayer wiring substrate 1A according to a modification in which the top surface is flattened in this way. As a result of this grinding, although the areas of exposed portions of the printed wiring electrodes 7 and 11 at the top surface 3c of the first insulating layer 3 have been slightly reduced, the flatness of the top surface can be effectively enhanced. Further, there may be a case in which it is required that the area of the printed wiring electrode exposed at the top surface be reduced. In that case, portions of the printed wiring electrodes 7 and 11 exposed at the top surface can be reduced in size by grinding, as in the present modification.

Figure 5:
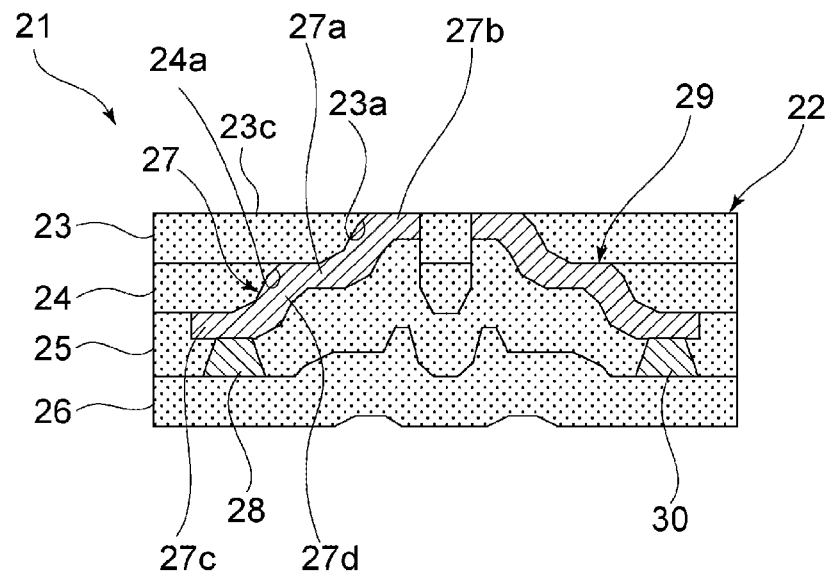
FIG. 5 is a front sectional view of a multilayer wiring substrate according to a third embodiment of the present disclosure.
Figure 6:
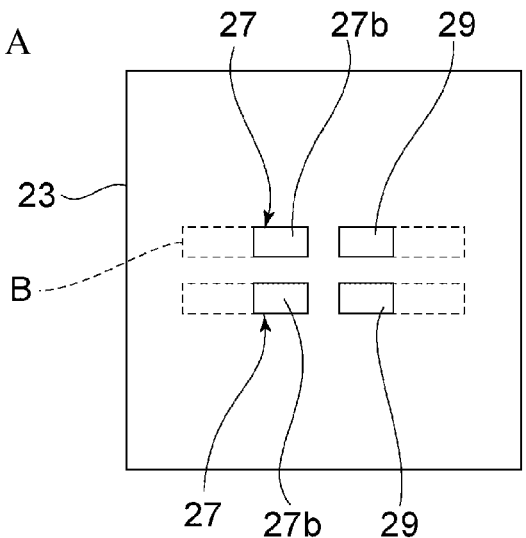
FIG. 6A to FIG. 6C are schematic plan views of first to third insulating layers in a multilayer wiring substrate of a third embodiment of the present disclosure.
Figure 6:
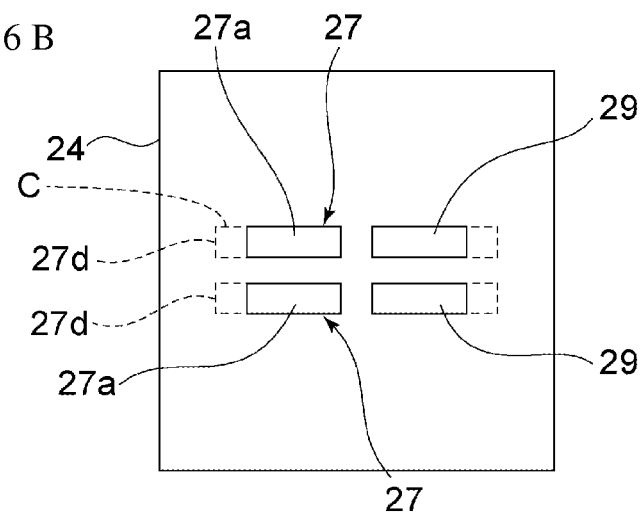
Figure 6:
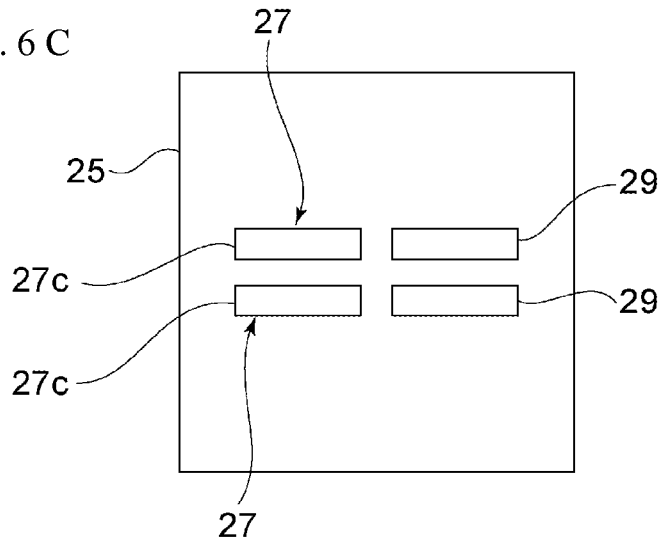

FIG. 5 is a front sectional view of a multilayer wiring substrate according to a third embodiment of the present disclosure. A multilayer wiring substrate 21 includes a multilayer body 22. The multilayer body 22 includes insulating layers 23-26 stacked on top of one another. The multilayer wiring substrate 21 includes printed wiring electrodes 27 and 29. FIGS. 6A-6C are schematic plan views of the insulating layers 23-25. A dotted line B in FIG. 6A and a dotted line C in FIG. 6B illustrate the outlines of portions of the respective insulating layers 23 and 24 of the printed wiring electrodes 27 and 29 not exposed at the top surfaces of the insulating layers 23 and 24.

The printed wiring electrode 27 will be described as representative of the printed wiring electrodes 27 and 29. The printed wiring electrode 27 extends from a top surface 23c of the insulating layer 23 to the top surface of the insulating layer 25. In other words, the printed wiring electrode 27 includes a first wiring electrode portion 27a located on the insulating layer 24 and a second wiring electrode portion 27b that joins to the first wiring electrode portion 27a.

The second wiring electrode portion 27b extends to a through hole 23a of the insulating layer 23 and is exposed at the top surface 23c of the insulating layer 23, i.e., the top surface of the multilayer wiring substrate 21. Hence, a structure including the first wiring electrode portion 27a and the second wiring electrode portion 27b is similar to the printed wiring electrode 7 of the first embodiment.

Unlike the first embodiment, in the present embodiment, a second wiring electrode portion 27d and a first wiring electrode portion 27c are further joined below the first wiring electrode portion 27a. The first wiring electrode portion 27c is located on the insulating layer 25, and the second wiring electrode portion 27d is provided so as to be joined to the first wiring electrode portion 27c. The second wiring electrode portion 27d extends into a through hole 24a provided in the insulating layer 24, and is further exposed at the top surface of the insulating layer 24 and joins to the first wiring electrode portion 27a.

The second printed wiring electrode 29 is formed similarly to the first printed wiring electrode 27.

A via hole conductor 28 provided in the insulating layer 25 is electrically connected to the bottom surface of the first wiring electrode portion 27c of the printed wiring electrode 27. Similarly, a via hole conductor 30 is electrically connected to the printed wiring electrode 29.

The printed wiring electrode 27 may be formed so as to extend through three or more insulating layers, as in the present embodiment. In other words, the second insulating layer 24 is located below the insulating layer 23 and, again, the second wiring electrode portion 27d and the first wiring electrode portion 27c may be repeatedly formed in the second insulating layer 24 and the insulating layer 25 provided below it. As a result, compared with the first embodiment, an increase in the wiring density of a wiring structure, a reduction in cost, and suppression of degradation in electric characteristics can be realized further effectively.

Figure 7:
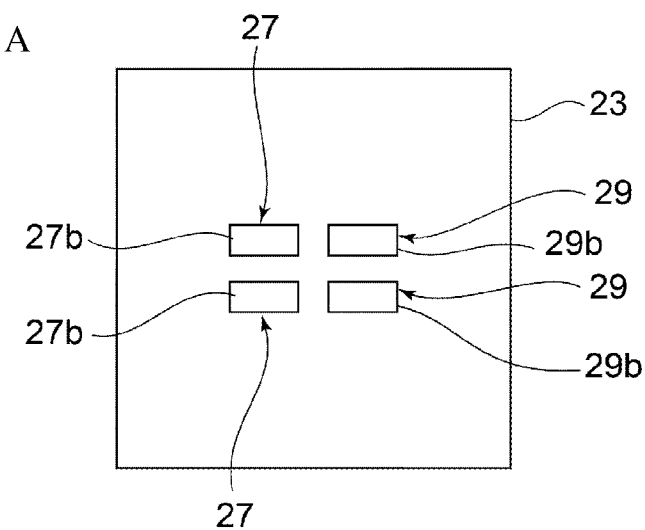
FIG. 7A to FIG. 7C are schematic plan views of first to third insulating layers in a multilayer wiring substrate of a fourth embodiment of the present disclosure.
Figure 7:
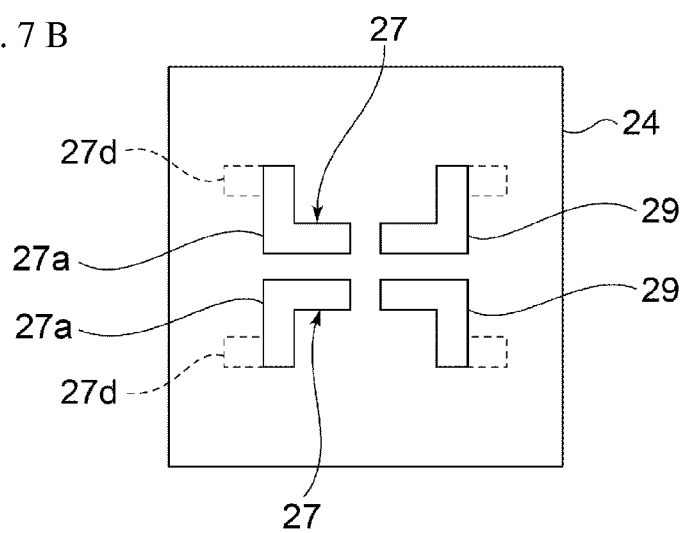
Figure 7:
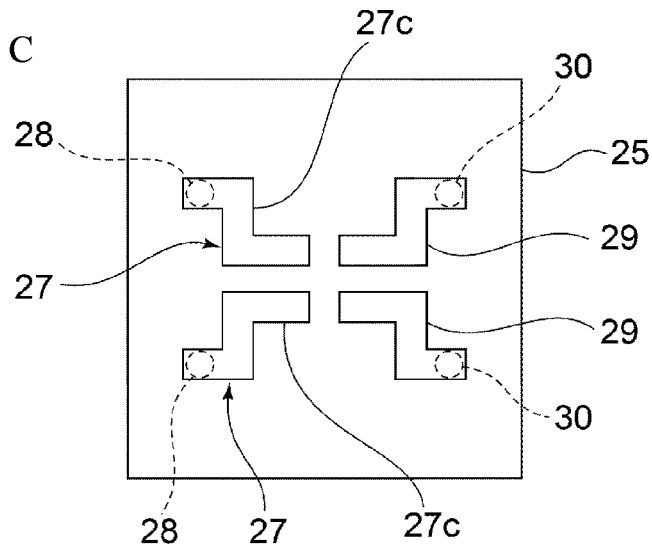

FIGS. 7(a)-(c) are schematic plan views of respective insulating layers in a multilayer wiring substrate according to a fourth embodiment. FIGS. 7A-7C are diagrams respectively corresponding to FIGS. 6A-6C. The multilayer wiring substrate of the fourth embodiment has a front sectional structure similar to that of the third embodiment. In other words, the multilayer wiring substrate of the fourth embodiment also has the sectional structure illustrated in FIG. 5. Hence, identical portions are denoted by the same reference symbols and the descriptions thereof are omitted.

In the fourth embodiment, the shapes of the printed wiring electrodes 27 and 29 are different from those in the third embodiment in plan view, as illustrated in FIGS. 7B and 7C. In other words, as illustrated in FIG. 7B, the printed wiring electrode 27 is bent in an L shape in the first wiring electrode portion 27a.

As illustrated in FIG. 7C, in the first wiring electrode portion 27c, the first wiring electrode portion 27c is bent by 90 degrees at two positions. By making the printed wiring electrode 27 have a bent portion rather than a strip shape in the first wiring electrode portions 27a and 27c, a further increase in the wiring density of a wiring structure including the printed wiring electrode 27 is realized.

More specifically, in the top surface of the uppermost insulating layer 23, the pitch of the printed wiring electrodes 27, the pitch of the printed wiring electrodes 29, and the distance between the printed wiring electrodes 27 and 29, i.e., the pitch of the second wiring electrode portions 27b, the pitch of the second printed wiring electrodes 29b, and the distance between the second wiring electrode portions 27b and 29b are small. On the other hand, as a result of the first wiring electrode portions 27a and 27c being made to have the shapes described above, on the lower insulating layers side, the pitch of the via hole conductors 28, the pitch of the via hole conductors 30, and the distance between the via hole conductors 28 and 30 can be increased at least in a portion. Hence in the multilayer wiring substrate 21, the electrode pitch on the bottom surface can be made to be larger than the electrode pitch on the top surface.

As a result, components having bumps or electrodes with a small pitch can be mounted on the top surface, and electrical connection to the outside can be easily made on the bottom surface side.

Figure 8:
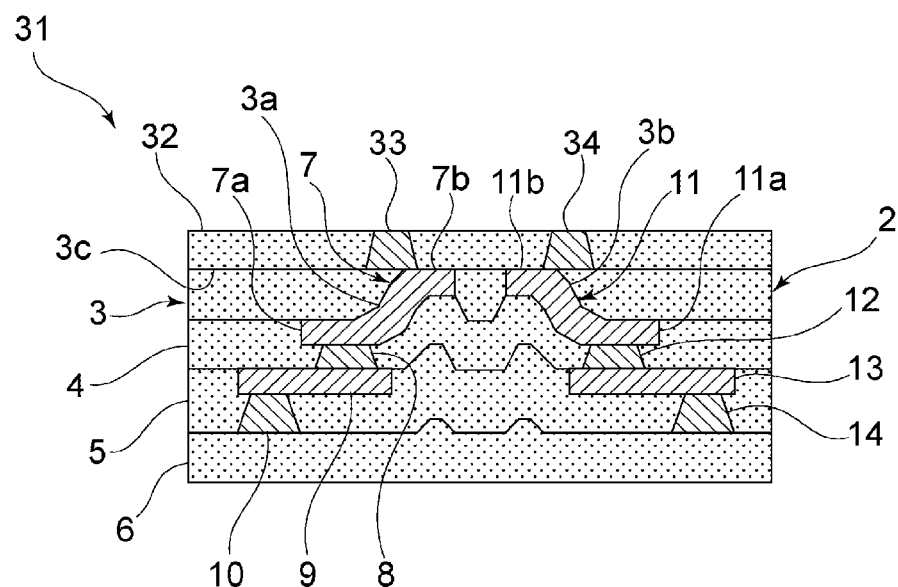
FIG. 8 is a front sectional view of a multilayer wiring substrate according to a fifth embodiment of the present disclosure.

FIG. 8 is a front sectional view of a multilayer wiring substrate according to a fifth embodiment of the present disclosure. In a multilayer wiring substrate 31 of the present embodiment, a third insulating layer 32 is further stacked on the top surface of the multilayer wiring substrate 1 of the first embodiment. Via hole conductors 33 and 34 are formed in the third insulating layer 32. The top surfaces of the via hole conductors 33 and 34 are exposed. The bottom surfaces of the via hole conductors 33 and 34 are connected to the second wiring electrode portions 7b and 11b of the printed wiring electrodes 7 and 11. In this manner, the printed wiring electrodes 7 and 11 need not be located on the outermost layer of the multilayer wiring substrate in the present disclosure.

Figure 9:
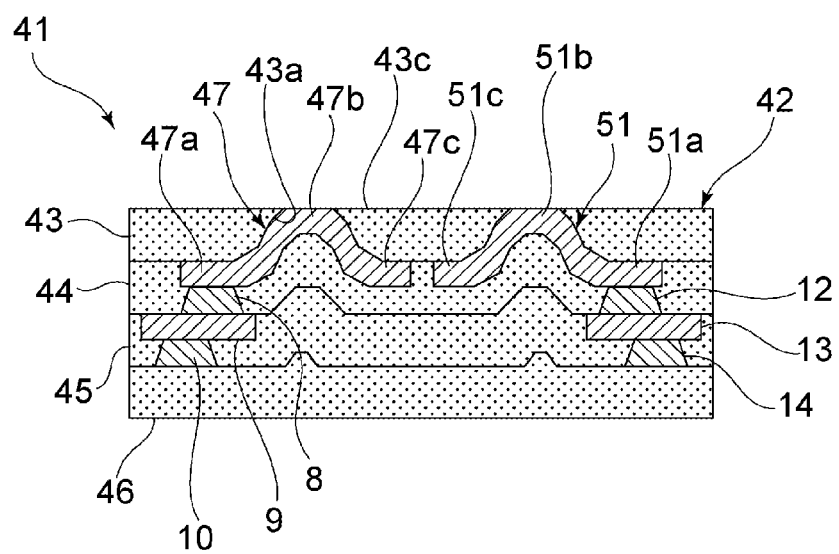
FIG. 9 is a front sectional view of a multilayer wiring substrate according to a sixth embodiment of the present disclosure.

FIG. 9 is a front sectional view of a multilayer wiring substrate according to a sixth embodiment of the present disclosure. A multilayer wiring substrate 41 includes a multilayer body 42. The multilayer body 42 has a structure in which a first insulating layer 43, a second insulating layer 44, a third insulating layer 45, and a fourth insulating layer 46 are stacked on top of one another. The multilayer body 42 includes printed wiring electrodes 47 and 51 provided therein. The present embodiment is similar to the multilayer wiring substrate 1 of the first embodiment except that the printed wiring electrodes 47 and 51 are provided. In other words, the via hole conductors 8 and 12 are formed in the second insulating layer 44. The wiring electrodes 9 and 13 are formed on the third insulating layer 45 so as to be connected to the via hole conductors 8 and 12, and the via hole conductors 10 and 14 are provided in the third insulating layer 45.

The printed wiring electrode 47 will be described as representative of the printed wiring electrodes 47 and 51.

The printed wiring electrode 47 includes a first wiring electrode portion 47a located on the second insulating layer 44. A second wiring electrode portion 47b extending to a through hole 43a is provided so as to be joined to the first wiring electrode portion 47a. The second wiring electrode portion 47b is exposed at a top surface 43c of the first insulating layer 43. Hence, the first wiring electrode portion 47a and the second wiring electrode portion 47b are similar to the first wiring electrode portion 7a and the second wiring electrode portion 7b in the multilayer wiring substrate 1.

In the present embodiment, a third wiring electrode portion 47c is provided so as to be joined to the second wiring electrode portion 47b. The third wiring electrode portion 47c is joined to an end portion of the second wiring electrode portion 47b, the end portion being different from the end portion joined to the first wiring electrode portion 47a. The third wiring electrode portion 47c extends through the through hole 43a and further extends to the second insulating layer 44 again. Similarly, the printed wiring electrode 51 includes a first wiring electrode portion 51a, a second wiring electrode portion 51b, and a third wiring electrode portion 51c.

Figure 10:
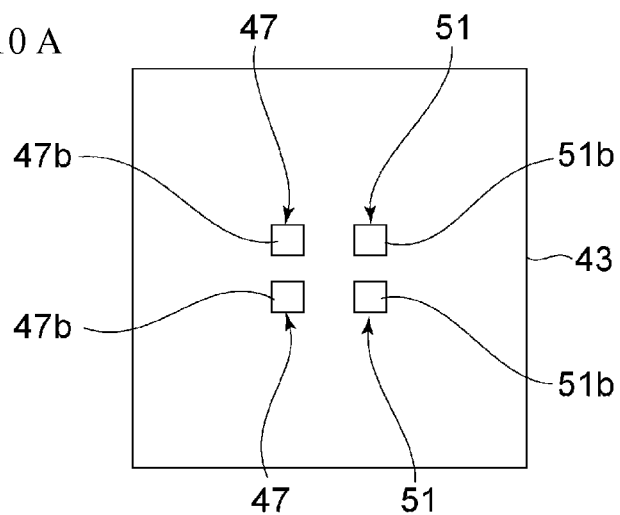
FIG. 10A to FIG. 10C are schematic plan views of first to third insulating layers in a multilayer wiring substrate of the sixth embodiment of the present disclosure.
Figure 10:
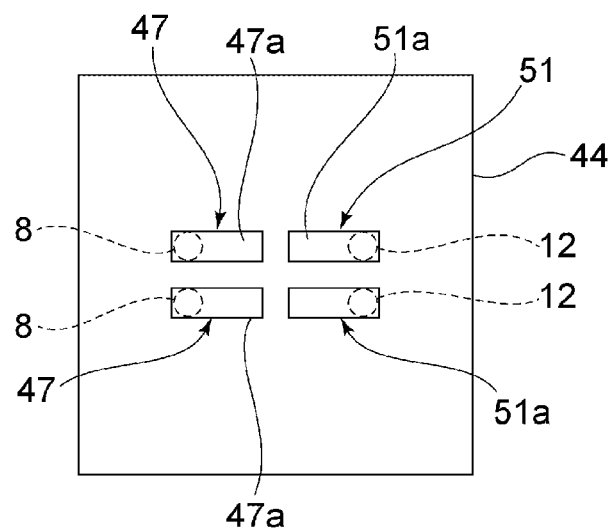
Figure 10:
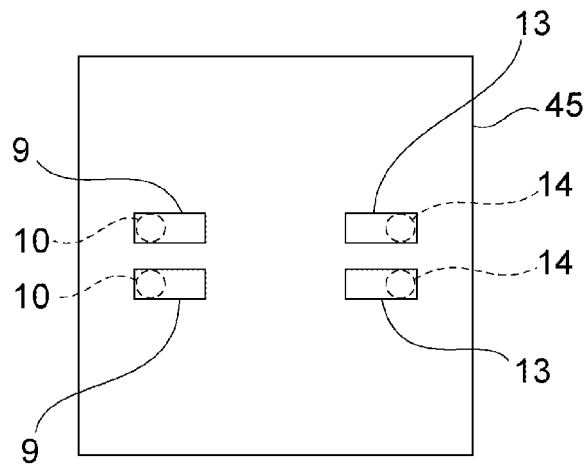

FIGS. 10A-10C are schematic plan views of the first to third insulating layers 43-45 described above. As is clear from comparison of FIG. 10A and FIG. 10B, the first and third wiring electrode portions 47a and 47c are located on the two sides of the second wiring electrode portion 47b exposed at the top surface in plan view, in the printed wiring electrode 47.

As in the present embodiment, not only the first wiring electrode portion 47a but also the third wiring electrode portion 47c may be joined to the second wiring electrode portion 47b. In this case, the printed wiring electrode 47 is embedded in the multilayer body 42 in both the first wiring electrode portion 47a and the second wiring electrode portion 47b. Hence, the coupling strength between the printed wiring electrode 47 and the multilayer body 42 can be increased. As a result, when external connection is made by using the second wiring electrode portion 47b, the connection strength can be increased. Further, the area of the exposed portion functioning as an electrode land can be reduced.

Note that the shapes of the first wiring electrode portion 47a and the third wiring electrode portion 47c in plan view need not be strips as illustrated in FIG. 10B, and may be any shapes in plan view, such as L-shapes and straight lines.

Figure 11:
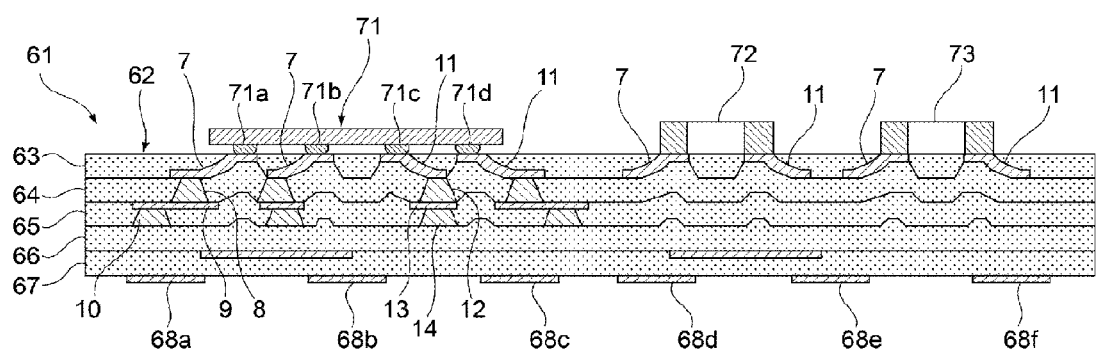
FIG. 11 is a front sectional view illustrating an example application to a composite module as a seventh embodiment of the present disclosure.

FIG. 11 is a front sectional view illustrating an application example in which the multilayer wiring substrate of the present disclosure is applied to a composite module as a seventh embodiment of the present disclosure. A composite module 61 has the structure of the multilayer wiring substrate of the present disclosure.

First to fifth insulating layers 63-67 are stacked on top of one another in a multilayer body 62. The printed wiring electrodes 7, 7, 11, and 11 similar to those of the first embodiment are provided in a portion where the first and second insulating layers 63 and 64 are stacked on top of one another. An electronic component 71, such as an IC, having small-pitch bumps is mounted in portions of the printed wiring electrodes 7 and 11 exposed at the first insulating layer 63.

The electronic component 71, such as an IC, having small-pitch bumps includes bumps 71a-71d on the bottom surface thereof. The bumps 71a-71d are made to be in contact with the portions of the printed wiring electrodes 7 and 11 exposed at the first insulating layer 63. In this case, even when the pitch of the bumps 71a-71d of the electronic component 71, such as an IC, having small-pitch bumps is small, the composite module 61 can support the pitch by decreasing the pitch of the portions of the printed wiring electrodes 7 and 11 exposed at the top surface.

Note that the portions of the printed wiring electrodes 7 and 11 exposed at the first insulating layer 63 form the contact portions in contact with electronic components.

On the other hand, terminal electrodes 68a-68f for external connection are formed on the underside of the composite module 61. Each of the terminal electrodes 68a-68f is electrically connected to one of the printed wiring electrodes 7 and 11 described above. The pitch of the terminal electrodes 68a to 68f is considerably larger than the pitches of portions of the printed wiring electrodes 7 and 11 exposed at the top surface of the composite module 61. Hence, electrical connection to the outside can be easily realized.

Note that similarly to the first embodiment, the via hole conductor 8, the wiring electrode 9, the via hole conductor 10, the via hole conductor 12, the wiring electrode 13, and the via hole conductor 14 are connected to the lower ends of the printed wiring electrodes 7 and 11.

In the multilayer body 62 in the composite module 61, electronic components, such as capacitors 72 and 73, are mounted in portions different from a portion to which the electronic component 71, such as an IC, having small-pitch bumps is connected. The capacitors 72 and 73 are also connected to the portions of the printed wiring electrodes 7 and 11 exposed at the top surface of the multilayer body 62.

Also in the composite module 61, the printed wiring electrodes 7 and 11 are used similarly to the multilayer wiring substrate 1 described above and, hence, an increase in the wiring density of a wiring structure and a reduction in cost can be realized.

Note that specific examples of the composite modules in the present embodiment include a wireless LAN module, an antenna switch module for a cellular phone, and the like. Examples of electronic components having small-pitch bumps used in these modules include semiconductor components such as a switching IC and an RF-IC, and SAW devices such as a SAW filter and a SAW duplexer.

Figure 12:
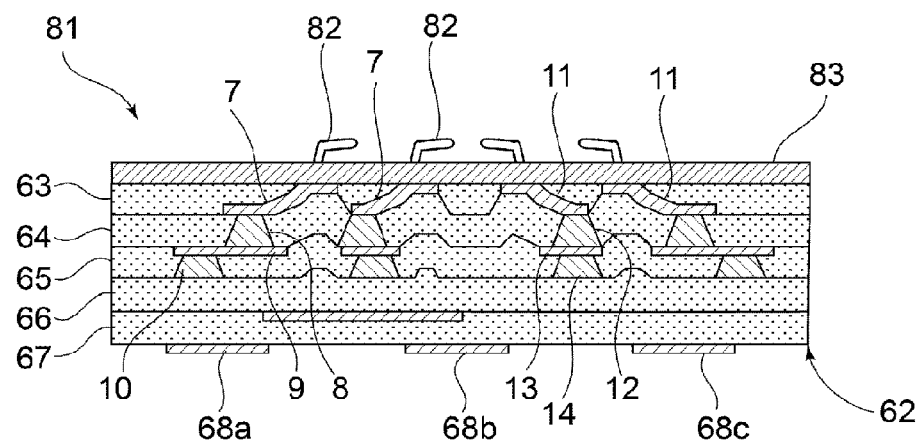
FIG. 12 is a front sectional view illustrating an example application to a probe card substrate as an eighth embodiment of the present disclosure.

FIG. 12 is a front sectional view illustrating a probe card substrate as an eighth embodiment of the present disclosure.

A probe card substrate 81 of the present embodiment includes a first insulating layer 63. A thin film layer 83 formed of an insulating material is formed on the first insulating layer 63. The thin film layer 83 is formed of an appropriate insulating material.

Further, a plurality of probes 82 are provided on the thin film layer 83. The plurality of probes 82 extend into the thin film layer 83, although not illustrated. The not-illustrated end portions of the plurality of probes 82 are electrically connected to the printed wiring electrodes 7 and 11 with wiring electrodes provided within the thin film layer 83 interposed therebetween. In other words, the wiring electrodes formed within the thin film layer 83 extend to the bottom surface of the thin film layer 83. These wiring electrodes are electrically connected to portions of the printed wiring electrodes 7 and 11 exposed at the top surface of the multilayer body 62, i.e., the top surface of the first insulating layer 63.

Consequently, similarly to the multilayer wiring substrate 1, the probe card substrate 81 also allows an increase in the wiring density of a wiring structure and a reduction in cost to be realized, as a result of the printed wiring electrodes 7 and 11 being provided.

REFERENCE SIGNS LIST 1, 1A multilayer wiring substrates
2 multilayer body
3-6 first to fourth insulating layers
3A-6A first to fourth ceramic green sheets
3a, 3b through holes
3c top surface
7, 7A printed wiring electrodes
7a, 7b first and second wiring electrode portions
8, 12 via hole conductors
9, 13 wiring electrodes
10, 14 via hole conductors
11 printed wiring electrode
11a, 11b first and second wiring electrode portions
21 multilayer wiring substrate
22 multilayer body
23-26 insulating layers
23a, 24a through holes
23c top surface
27 printed wiring electrode
27a, 27c first wiring electrode portions
27b, 27d second wiring electrode portions
28, 30 via hole conductors
29 printed wiring electrode
31 multilayer wiring substrate
32 third insulating layer 33, 34 via hole conductors
41 multilayer wiring substrate
42 multilayer body
43-46 first to fourth insulating layers
43a through hole
43c top surface
47 printed wiring electrode
47a-47c first to third wiring electrode portions
51 printed wiring electrode
51a-51c first to third wiring electrode portions
61 composite module
62 multilayer body
63-67 first to fifth insulating layers
68a-68f terminal electrodes
71 electronic component, such as an IC, having small-pitch bumps
71a-71d bumps
72, 73 capacitors
81 probe card substrate
82 probe
83 thin film layer

The invention claimed is:
1. A multilayer wiring substrate comprising:
a multilayer body including a first insulating layer and a second insulating layer stacked on a bottom surface of the first insulating layer; and
a wiring electrode located within the multilayer body,
wherein the wiring electrode is a printed wiring electrode provided by printing with and sintering conductive paste,
wherein the first insulating layer includes a through hole extending through the first insulating layer in a stacking direction of the multilayer body,
wherein the printed wiring electrode includes a first wiring electrode portion embedded in an upper surface of the second insulating layer and a second wiring electrode portion configured to join to the first wiring electrode portion, the second wiring electrode portion is configured to extend into the through hole provided in the first insulating layer and is further configured to be exposed at a top surface of the first insulating layer, and
wherein the second insulating layer includes a recess formed on a lower surface and a protrusion formed on an upper surface that are aligned below the second wiring electrode portion of the printed wiring electrode.
2. The multilayer wiring substrate according to claim 1, wherein, on a lower side of at least part of the second wiring electrode portion of the printed wiring electrode exposed at the top surface of the first insulating layer, a top surface of the second insulating layer is expanded toward the first insulating layer side compared with the rest of the second insulating layer.
3. The multilayer wiring substrate according to claim 1, wherein the printed wiring electrode is provided in a plurality.
4. The multilayer wiring substrate according to claim 1, wherein the first insulating layer is located at an outermost layer among the plurality of insulating layers of the multilayer body.
5. The multilayer wiring substrate according to claim 1, wherein the printed wiring electrode includes a third wiring electrode portion that joins to one of two end portions of the second wiring electrode portion, the one of the two end portions being farther from the first wiring electrode portion than the other of the two end portions is, the third wiring electrode extends through the through hole and extends to the second insulating layer.
6. A probe card substrate comprising: the multilayer wiring substrate according to claim 1; and a plurality of probes provided on one surface side of the multilayer wiring substrate.
7. A method of manufacturing the multilayer wiring substrate according to claim 1, the method comprising:
a step of forming the first insulating layer including a through hole;
a step of forming a wiring pattern on the second insulating layer by printing with conductive paste;
a step of stacking the first insulating layer on the second insulating layer such that the through hole overlaps the wiring pattern; and
a step of pressure-bonding, in a stacking direction, a multilayer body including the first and second insulating layers such that the wiring pattern is embedded in the through hole in the first insulating layer.
8. The method of manufacturing the multilayer wiring substrate according to claim 7, wherein the method further comprises a step of stacking at least one other insulating layer on at least one of an outermost layer of the first insulating layer and an outermost layer of the second insulating layer in the stacking direction.
9. The method of manufacturing the multilayer wiring substrate according to claim 8, wherein the other insulating layer is stacked on the outermost layer of the second insulating layer in the stacking direction such that the first insulating layer becomes the outermost surface of the multilayer body.
10. The multilayer wiring substrate according to claim 2, wherein the printed wiring electrode is provided in a plurality.
11. The multilayer wiring substrate according to claim 2, wherein the first insulating layer is located at an outermost layer among the plurality of insulating layers constituting the multilayer body.
12. The multilayer wiring substrate according to claim 3, wherein the first insulating layer is located at an outermost layer among the plurality of insulating layers constituting the multilayer body.
13. The multilayer wiring substrate according to claim 2, wherein the printed wiring electrode includes a third wiring electrode portion that joins to an end portion of the second wiring electrode portion that is different from an end portion of the second wiring electrode portion close the first wiring electrode portion, the third wiring electrode extends through the through hole and extends to the second insulating layer.
14. The multilayer wiring substrate according to claim 3, wherein the printed wiring electrode includes a third wiring electrode portion that joins to an end portion of the second wiring electrode portion that is different from an end portion of the second wiring electrode portion close the first wiring electrode portion, the third wiring electrode extends through the through hole and extends to the second insulating layer.
15. The multilayer wiring substrate according to claim 4, wherein the printed wiring electrode includes a third wiring electrode portion that joins to an end portion of the second wiring electrode portion that is different from an end portion of the second wiring electrode portion close the first wiring electrode portion, the third wiring electrode extends through the through hole and extends to the second insulating layer.

16. A probe card substrate comprising: the multilayer wiring substrate according to claim 2; and a plurality of probes provided on one surface side of the multilayer wiring substrate.

17. A probe card substrate comprising: the multilayer wiring substrate according to claim 2; and a plurality of probes provided on one surface side of the multilayer wiring substrate.

18. A probe card substrate comprising: the multilayer wiring substrate according to claim 3; and a plurality of probes provided on one surface side of the multilayer wiring substrate.

19. A probe card substrate comprising: the multilayer wiring substrate according to claim 4; and a plurality of probes provided on one surface side of the multilayer wiring substrate.

20. A probe card substrate comprising: the multilayer wiring substrate according to claim 5; and a plurality of probes provided on one surface side of the multilayer wiring substrate.

* * * * *